(12) United States Patent
Lee

(10) Patent No.: US 7,960,979 B1
(45) Date of Patent: Jun. 14, 2011

(54) UNIVERSAL RESISTANCE TESTING DEVICE FOR ELECTRICAL COMPONENTS

(75) Inventor: Henry Joe Lee, Florence, SC (US)

(73) Assignee: Honda Motor Co., Ltd., Tokyo (JP)

( * ) Notice: Subject to any disclaimer, the term of this patent is extended or adjusted under 35 U.S.C. 154(b) by 555 days.

(21) Appl. No.: 12/058,107

(22) Filed: Mar. 28, 2008

(51) Int. Cl.
*G01R 27/08* (2006.01)

(52) U.S. Cl. ........................ 324/706; 324/705

(58) Field of Classification Search .............. 324/705, 324/706
See application file for complete search history.

(56) References Cited

U.S. PATENT DOCUMENTS

| | | | |
|---|---|---|---|
| 3,536,997 A * | 10/1970 | Holt | 324/712 |
| 3,546,436 A | 12/1970 | Holzer | |
| 3,588,690 A | 6/1971 | Griffin | |
| 3,646,435 A * | 2/1972 | Rozenson et al. | 324/725 |
| 3,946,200 A | 3/1976 | Juodikis | |
| 3,972,237 A * | 8/1976 | Turner | 374/169 |
| 4,467,182 A | 8/1984 | Merkel | |
| 4,503,706 A * | 3/1985 | Kolodjski | 73/204.14 |
| 4,639,611 A | 1/1987 | Sticher | |
| 4,647,919 A * | 3/1987 | Wright et al. | 340/608 |
| 4,845,342 A | 7/1989 | Chen | |
| 4,906,820 A | 3/1990 | Haarmann et al. | |
| 4,910,689 A | 3/1990 | Shibamiya | |
| 4,996,477 A * | 2/1991 | Keeler et al. | 324/772 |
| 5,583,442 A * | 12/1996 | Isham et al. | 324/610 |
| 6,433,554 B1 * | 8/2002 | Kawate et al. | 324/500 |
| 6,611,135 B1 * | 8/2003 | Schroeder | 324/76.51 |
| 6,625,555 B2 | 9/2003 | Kuan et al. | |
| 6,763,108 B1 * | 7/2004 | Stephens | 379/399.01 |

* cited by examiner

*Primary Examiner* — Jeff Natalini
(74) *Attorney, Agent, or Firm* — Rankin Hill & Clark LLP

(57) ABSTRACT

A universal resistance testing device is provided and includes a bridge circuit, a metering circuit, a comparator circuit, and an output circuit. The universal resistance testing device is incorporated into a control circuit and is used to verify a resistive value of a variable resistance device. The universal resistance testing device includes multiple replaceable resistors to thereby allow the universal resistance testing device to be used in the same control circuit to test different variable resistance devices having a different resistive value.

15 Claims, 2 Drawing Sheets

UNIVERSAL RESISTANCE TESTING DEVICE FOR ELECTRICAL COMPONENTS

BACKGROUND OF THE INVENTION

1. Field of the Invention

The present invention relates to a universal resistance testing device to test electrical components for proper operation. More specifically, the present invention relates to a universal resistance testing device to measure and verify an external resistance of a variable resistance device.

2. Description of Related Art

Variable resistance devices exist in various styles and perform various functions in many applications throughout the automotive, power sports, motorcycle, and power equipment industries. For example, all terrain vehicles (ATV's) utilize variable resistance devices to provide vehicle information to the operator that may be visually displayed. Some examples of a variable resistance device may include a gas tank level sensor, a vehicle angle sensor, etc. It is important that the variable resistance devices operate properly so that proper information is relayed to the operator of the ATV.

In order to ensure proper operation of the variable resistance devices the quality of the devices need to be verified. Specifically, the resistance of the variable resistance device needs to be verified that it is the proper resistive value. Different variable resistance devices, however, have a different resistance. In other words, the resistance of the gas tank level sensor may have a different resistance than the vehicle angle sensor. Thus, a different testing device is required to test each of the different variable resistance devices. Therefore, what is required is a universal resistance testing device that can be incorporated into a control circuit to thereby test different variable resistance devices.

SUMMARY OF THE INVENTION

In accordance with one aspect, the present invention overcomes the above mentioned disadvantages by providing a universal resistance testing device to measure a resistance of a variable resistance device. The universal resistance testing device includes a bridge circuit having a first branch circuit and a second branch circuit, wherein the first branch circuit includes two removable resistors and the second branch circuit includes a single removable resistor and a means to electrically connect and disconnect an external resistance having a known resistive value. The device further includes a metering circuit having a meter to measure an output of the bridge circuit, a comparator circuit having a multiple removable resistors, and an output circuit having a transistor, wherein the output circuit receives an electric signal from the comparator circuit and outputs an electric signal to a signaling device thereby actuating the signaling device. A resistive value of the two removable resistors from the first branch circuit and a resistive value of the single removable resistor of the second branch circuit is determined based on the known resistive value of the external resistance such that a ratio of the two removable resistors from the first branch circuit is equal to a ratio of the single removable resistor and the known resistive value of the external resistance of the second branch circuit. In addition, one of the plurality of removable resistors of the comparator circuit is a voltage sensing resistor and the comparator circuit compares a voltage across the voltage sensing resistor to a reference voltage to verify the resistive value of the external resistance.

Additional benefits and advantages of the present invention will become apparent to those skilled in the art to which it pertains upon a reading and understanding of the following detailed specification.

BRIEF DESCRIPTION OF THE DRAWINGS

The invention may take physical form in certain parts and arrangement of parts, a preferred embodiment of which will be described in detail in this specification and illustrated in the accompanying drawings that form a part of the specification.

DETAILED DESCRIPTION OF THE INVENTION

Figure 1:
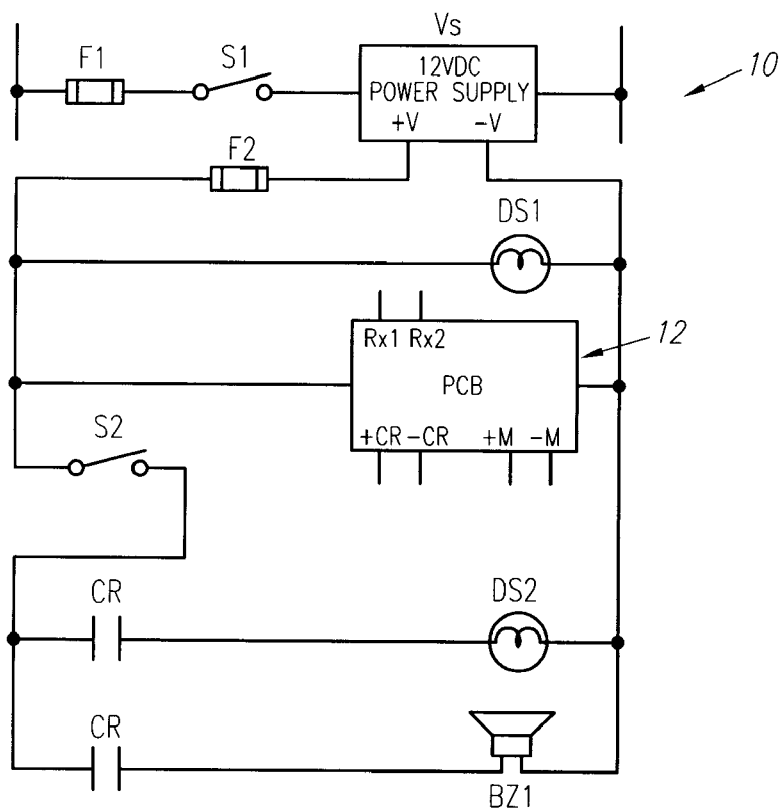
FIG. 1 shows an example schematic of a testing-control circuit incorporating a universal resistance testing device in accordance with the present invention.
Figure 3A:
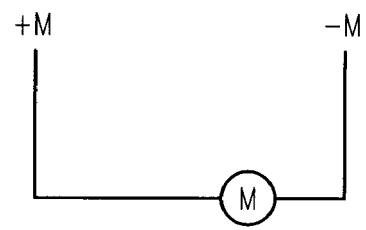
FIGS. 3a-3c show the external electrical connections for the universal resistance testing device of FIG. 2.
Figure 3B:
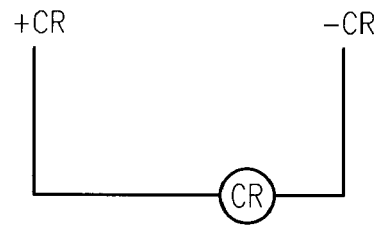
Figure 3C:
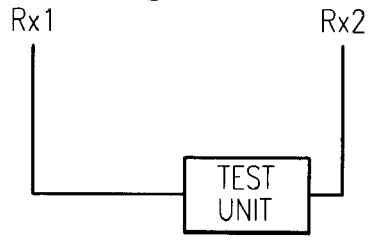

Referring now to the drawings, FIG. 1 shows a schematic of a testing-control circuit 10 incorporating the present invention. The testing-control circuit 10 includes an external power source Vs, a power switch S1, a power indicating lamp DS1, fuses F1, F2, a start/stop switch S2, control relay(s) CR, and test signaling devices, such as, an indicating lamp DS2 or a speaker BZ1. The basic operation of the testing-control circuit 10 is commonly known in the art and will not be discussed in further detail. The testing-control circuit 10 also includes the inventive universal resistance testing device 12. The universal resistance testing device 12 when incorporated into the testing-control circuit 10 is used to measure the resistance of a variable resistance device, such as, a gasoline tank level sensor, a vehicle angle sensor, etc., to thereby verify the quality of the variable resistance device.

Figure 2:
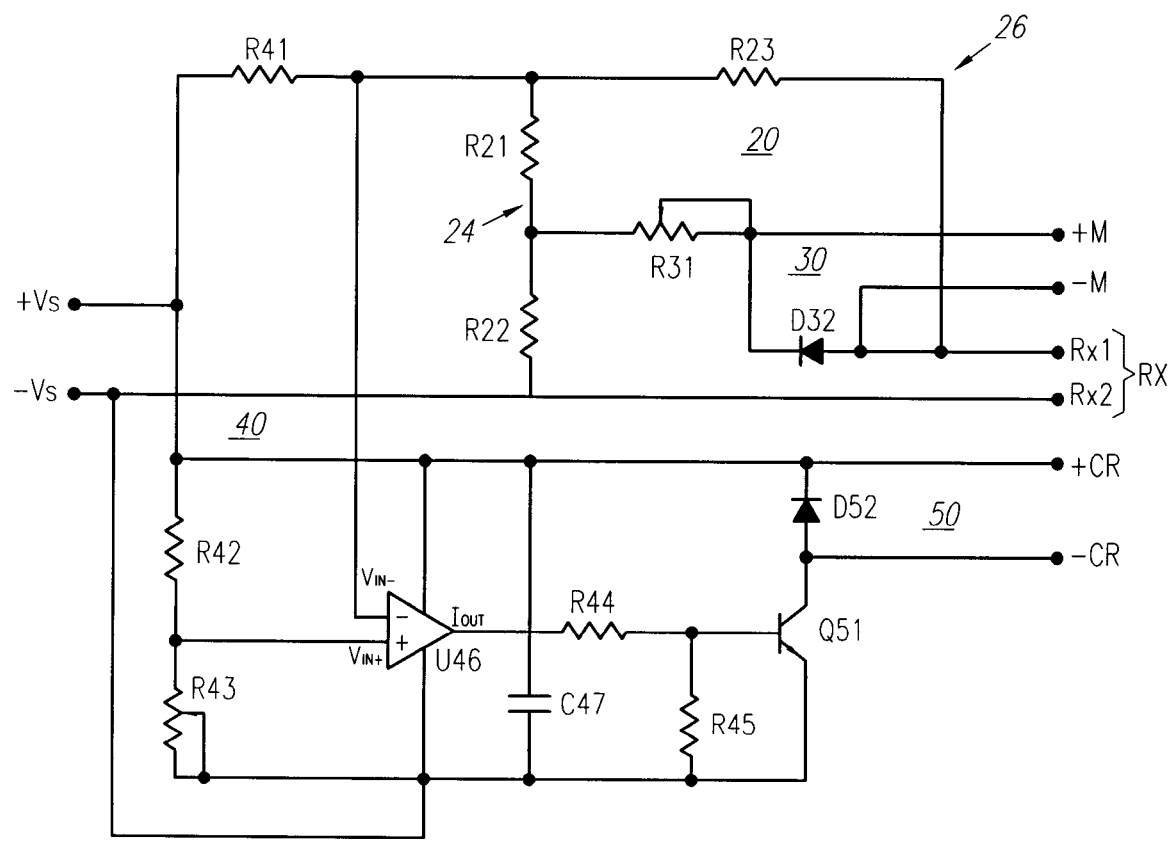
FIG. 2 is a schematic of the universal resistance testing device.

Referring now to FIG. 2, FIG. 2 shows a schematic of the universal resistance testing device 12. The universal resistance testing device 12 includes four circuits including a bridge circuit 20, a metering circuit 30, a comparator circuit 40 and an output circuit 50. The universal resistance testing device 12 is preferably mounted to a printed circuit board PCB (see FIG. 1). The PCB contains sockets, which allows easy replacement of one or more resistor within the universal resistance testing device 12 with a resistor having a different resistive value. Thus, different variable resistance devices may be tested using the same universal testing device 12 by simply changing the value of one or more resistors, as will be explained further below.

Referring to FIGS. 2 and 3a-3c, the bridge circuit 20 is comprised of three resistors with a known resistance R21, R22, R23, and the resistance of the variable resistance device. The resistance of the variable resistance device is also known as an external resistance and is measured at the terminals designated by reference characters Rx1 and Rx2. Thus, hereinafter the resistance of the variable resistance device will be referred to as an external resistance Rx. Resistors R21 and R22 form a first resistance branch 24, and resistor R23 and the external resistance Rx form a second resistance branch 26. The first resistance branch 24 and the second resistance branch 26 are in parallel thereby forming a Wheatstone resistance bridge circuit.

The Wheatstone bridge is a measuring device to measure an unknown resistance of a component by balancing the two branches 24, 26 of the bridge circuit 20. If the ratio of R22/R21 is equal to the ratio of Rx/R23 then the voltage drop across each branch 24, 26 is equal to the input voltage and no current will flow through the metering circuit 30 and the bridge circuit 20 is balanced. Thus, when the bridge circuit 20 is balanced then, R2/R1=Rx/R3. Rx can be calculated by solving for Rx (Rx=(R2/R1)R3). Similarly, if Rx is known the value of any one of R1-R3 can be calculated in the same manner. Thus, as will be explained further below, in order to verify the known value of the external resistance Rx, thereby verifying the quality of the variable resistance device, any one of R1-R3 can be replaced by a resistor of an appropriate value to balance the bridge.

The metering circuit 30 is comprised of an adjustable resistor R31, a diode D32, and a milliammeter M. The milliammeter M is connected to the terminals designated as +M and −M. The +M terminal is connected, via the adjustable resistor R31, to the first resistance branch 24 of the bridge circuit 20 between resistors R21 and R22. The −M terminal is connected to the second resistance branch 26 of the bridge circuit 20 between resistor R23 and the external resistance Rx. Thus, the milliammeter M measures the current created by any imbalance of the bridge circuit 20. In other words, as the external resistance Rx changes, the current through the milliammeter M will increase or decrease accordingly in response to the imbalances of the current through the first 24 and second 26 resistance branches. It should be noted that the meter M in the metering circuit 30 is not limited to a meter to measure current but can also be a meter to measure the voltage drop across one of the branches 24, 26. For purposes of simplicity, however, the present invention will be explained with reference to the milliammeter M.

The adjustable resistor R31 serves two functions. First, the adjustable resistor R31 serves as a current limiting device for the milliammeter M. In other words, the adjustable resistor R31 serves to limit the amount of current through the milliammeter M thereby protecting the milliammeter M. Second, the adjustable resistor R31 can be used as an adjustment means for the milliammeter M. Thus, the adjustable resistor R31 can be used to provide a maximum indication on the milliammeter M. The diode D32 protects the milliammeter M from a reverse current condition.

The comparator circuit 40 compares input voltages and includes multiple resistors R41, R42, R43, R44, and R45, an operational amplifier U46, and a capacitor C47. Resistors R41, R42, R44 and R45 have a known fixed value and resistor R43 is an adjustable resistor. The comparator circuit 40 is connected to the voltage source $+V_s$, $-V_s$, mentioned above (hereinafter referred to as Vs). The function of the comparator circuit 50 is to compare the input voltages at the non-inverting input $V_{in+}$ with the voltage at the inverting input $V_{in-}$ of the operational amplifier U46, as will be subsequently described.

The comparator circuit 50 monitors the voltage drop across resistor R41, which is connected to the inverting input $V_{in-}$ of the operational amplifier U46. Resistor R41 is commonly known as a voltage sensing resistor. The comparator circuit 40 compares this voltage with a reference voltage at the non-inverting input $V_{in+}$. The reference voltage non-inverting input $V_{in+}$ is generated by a voltage divider network formed by resistors R42 and R43. When the voltage at the inverting input $V_{in-}$ drops below the reference voltage at the non-inverting input $V_{in+}$ the transistors of the operational amplifier U46 turn on thereby allowing an output current $I_{out}$ to flow out of the operational amplifier U46. The output current $I_{out}$ flows into the resistor network comprised of resistors R44 and R45, which in turn controls the flow of current into the output circuit 50, as will be described below. The function of the capacitor C47 is to suppress any transient noise that may adversely affect the operational amplifier U46.

Depending on the type of variable resistance device being tested, one or more of resistors R41, R42, and R43 may be replaced with a resistor of a different value in order to achieve the proper reference voltage at $V_{in+}$.

The output circuit 50 outputs a signal to one or more external electrical signaling devices and includes an NPN transistor Q51 and a diode D52. As mentioned above, the output current $I_{out}$ of the operational amplifier U46 flows into the resistor network comprised of resistors R44 and R45, which controls the base current of the transistor Q51. The output current $I_{out}$ causes the transistor Q51 to go into saturation, thereby essentially turning on the transistor Q51. With the transistor Q51 in an on state, a low voltage is seen at the collector of the transistor Q51 and current flows from the collector to the emitter. The output of the output circuit 50 is connected to a control relay CR. Thus, when the transistor Q51 is in a saturated state the current from the emitter energizes a coil in the control relay CR, which in turn actuates one or more test signaling devices DS2, BZ1. The diode D52 protects the circuit from a reverse current condition.

Operation of the present invention will now be described. As mentioned above, different variable resistance devices have a different resistance. This resistance is known but in order to ensure quality of the device, the resistance needs to be verified. Thus, because the external resistance Rx is known, the values of R21-R23 are determined to thereby balance the bridge circuit 20, as explained above. Further, appropriate values for R41, R42, and R43 are chosen to obtain the proper reference voltage at $V_{in+}$. The resistors R21-23, R41, R42, and R43 are inserted into the PCB. The PCB is electrically connected to the control circuit 10, as shown in FIG. 1. Appropriate electrical connections are made to the milliammeter M, the external resistance Rx (the variable resistance device to be tested), and the control relay CR. Power is then applied to the universal resistance testing device 12 via the control circuit 10.

If the external resistance Rx is of proper value, which means that the variable resistance device is not defective, then the bridge circuit 20 is balanced and no current (or minimal current) will flow through the branches 24, 26 of the bridge circuit 20. In turn, no or minimal current will flow through the voltage sensing resistor R41, which means that there will be no or a minimal voltage drop across resistor R41. Thus, the voltage at the inverting input Vin− will fall below the reference input voltage at the non-inverting input Vin+, thereby causing the output current Iout to flow out of the operational amplifier U46. The increase in the output current Iout will cause the transistor Q51 to go into saturation thereby causing current to flow from the collector to the emitter and thus, to the control relay CR, as explained above. The current energizes the control relay CR, which in turn actuates the test signaling device(s) DS2, BZ1, thereby indicating that the external resistance Rx is of proper value and thus, verifying the quality of the variable resistance device.

If the external resistance Rx is not of proper value, which means that the variable resistance device is defective, then the bridge circuit 20 is not balanced and current will flow through the branches 24, 26 of the bridge circuit 20, which is measured by the milliammeter M. In turn, current will flow through voltage sensing resistor R41 and the voltage drop across the voltage sensing resistor R41, which is the input voltage seen at the inverting input Vin−, will not fall below the input reference voltage at the non-inverting input Vin+. Subsequently, the output current Iout will be zero and the transistor Q51 will not go into saturation. Thus, no current will flow from the collector to the emitter of the transistor Q51 and to the control relay CR. Therefore, the test signaling device(s)

DS2, BZ1 will not actuate, thereby indicating that the external resistance Rx is not of proper value and that the variable resistance device is defective.

One important feature of the present invention worth repeating is that one or more resistors in the universal resistance testing device 12 can be easily replaced with another resistor having a different resistive value. This flexibility allows the universal resistance testing device 12 to be incorporated into the same control circuit 10 to thereby verify the quality different variable resistance devices that have a different resistance.

While specific embodiments of the invention have been described and illustrated, it is to be understood that these embodiments are provided by way of example only and that the invention is not to be construed as being limited but only by proper scope of the following claims.

What is claimed is:

1. A universal resistance testing device to verify an external resistance, the universal resistance testing device comprising:
   a bridge circuit having a first branch circuit and a second branch circuit, wherein the first branch circuit includes two removable resistors selected from a plurality of resistors and the second branch circuit includes a single removable resistor selected from the plurality of resistors and a means to electrically connect and disconnect an external resistance having a known resistive value to be verified;
   a metering circuit having a meter to measure an output of the bridge circuit;
   a comparator circuit having a plurality of removable resistors; and
   an output circuit having a transistor, wherein the output circuit receives an electric signal from the comparator circuit and outputs an electric signal to a signaling device to actuate the signaling device,
   wherein a resistive value of the two removable resistors from the first branch circuit and a resistive value of the single removable resistor of the second branch circuit are known, such that a ratio of the two removable resistors from the first branch circuit is equal to a ratio of the single removable resistor and the known resistive value of the external resistance of the second branch circuit,
   wherein the two removable resistors in the first branch are interchangeable with two different removable resistors selected from the plurality of resistors that have a different known resistive value than the two removable resistors, and the single removable resistor in the second branch is interchangeable with a different single removable resistor selected from the plurality of resistors that has a different known resistive value than the single removable resistor, and the external resistance is replaceable with a different external resistance having a different known resistive value to be verified than the external resistance, such that a ratio of the two different removable resistors from the first branch circuit is equal to a ratio of the different single removable resistor and the known resistive value of the different external resistance of the second branch circuit,
   wherein one of the plurality of removable resistors of the comparator circuit is a voltage sensing resistor, and
   wherein the comparator circuit compares a voltage across the voltage sensing resistor to a reference voltage to verify the resistive value of the external resistance.

2. The universal resistance testing device of claim 1, wherein if the voltage across the voltage sensing resistor is less than the reference voltage, the comparator circuit outputs the electric signal to the output circuit and the output circuit outputs the electric signal to the signaling device which actuates the signaling device verifying that the known resistive value of the external resistance is correct.

3. The universal resistance testing device of claim 2, wherein the comparator circuit further includes an operational amplifier and a resistive network to determine the reference voltage and wherein the voltage across the voltage sensing resistor is an input voltage seen at an inverting input of the operational amplifier and the reference voltage is an input voltage of a non-inverting input of the operational amplifier.

4. The universal resistance testing device of claim 3, wherein the output circuit includes a transistor and the transistor goes into saturation when the input voltage of the inverting input is less than the reference voltage at the non-inverting input.

5. The universal resistance testing device of claim 4, wherein the metering circuit includes an adjustable resistor to limit the output from the bridge circuit to the meter.

6. The universal resistance testing device of claim 5, wherein the metering circuit further includes a diode to protect the meter from a reverse current condition and the output circuit further includes a diode to protect the transistor against a reverse current condition.

7. The universal resistance testing device of claim 1, wherein if the voltage across the voltage sensing resistor is not less than the reference voltage, the comparator circuit does not send the electric signal to the output circuit and the output circuit does not send the electric signal to the signaling device and the signaling device is not actuated thereby indicating that the resistive value of the external resistance is not correct.

8. A control circuit to verify a known resistance of a variable resistance device, the control circuit comprising:
   a power supply;
   a power switch;
   an indicating lamp;
   multiple current protection fuses;
   a start/stop switch;
   a control relay;
   a signaling device; and
   a universal resistance testing device having:
      a bridge circuit having a first branch circuit and a second branch circuit, wherein the first branch circuit includes two removable resistors selected from a plurality of resistors and the second branch circuit includes a single removable resistor selected from the plurality of resistors and a means to electrically connect and disconnect the variable resistance device to be verified;
      a metering circuit having a meter to measure an output current of the bridge circuit;
      a comparator circuit having a plurality of removable resistors; and
      an output circuit having a transistor, wherein the output circuit receives an output current from the comparator circuit and outputs a current to a signaling device to actuate the signaling device,
   wherein a resistive value of the two removable resistors from the first branch circuit and a resistive value of the single removable resistor of the second branch circuit are known, such that a ratio of the two removable resistors from the first branch circuit is equal to a ratio of the single removable resistor and the known resistance of the variable resistance device of the second branch circuit, wherein the two removable resistors in the first branch are interchangeable with two different removable resistors selected from the plurality of resistors that have a different known resistive value than the two removable resistors, and the single removable resistor in the second branch is interchangeable with a different single removable resistor selected from the plurality of resistors that has a different known resistive value than the single removable resistor, and the variable resistance device is replaceable with a different variable resistance device having a different known resistive value to be verified than the variable resistance device, such that a ratio of the two different removable resistors from the first branch circuit is equal to a ratio of the different single removable resistor and the known resistive value of the different variable resistance device of the second branch circuit, wherein one of the plurality of removable resistors of the comparator circuit is a voltage sensing resistor, and wherein the comparator circuit compares a voltage across the voltage sensing resistor to a reference voltage to verify the resistance of the variable resistance device.

9. The control circuit of claim 8, wherein the output circuit includes a transistor, wherein if the voltage across the voltage sensing resistor is less than the reference voltage, the comparator circuit outputs the output current to the transistor causing the transistor to go into saturation thereby allowing the current to flow from a collector to an emitter of the transistor, and wherein the current flows from the emitter to the control relay thereby energizing the control relay and allowing the current to flow to the signaling device thereby actuating the signaling device verifying that the known resistance of the variable resistance device is correct.

10. The control circuit of claim 9, wherein the comparator circuit further includes an operational amplifier and a resistive network to determine the reference voltage and wherein the voltage across the voltage sensing resistor is an input voltage seen at an inverting input of the operational amplifier and the reference voltage is an input voltage of a non-inverting input of the operational amplifier.

11. The control circuit of claim 10, wherein the metering circuit includes an adjustable resistor to limit the output current from the bridge circuit to the meter.

12. The universal resistance testing device of claim 11, wherein the metering circuit further includes a diode to protect the meter from a reverse current condition and the output circuit further includes a diode to protect the transistor against a reverse current condition.

13. The control circuit of claim 8, wherein if the voltage across the voltage sensing resistor is not less than the reference voltage, the comparator circuit does not generate the output current and the transistor does not go into saturation and the signaling device is not actuated thereby indicating that the resistance of the variable resistance device is not correct.

14. A method of verifying a resistance of a variable resistance device comprising the steps of:

providing a control circuit having a universal resistance testing device, wherein the universal resistance testing device is mounted to a printed circuit board and includes a bridge circuit having a first branch circuit and a second branch circuit, wherein the first branch circuit includes two removable resistors and the second branch circuit includes a single removable resistor and a means to electrically connect and disconnect a first variable resistance device, a metering circuit having a meter to measure an output current of the bridge circuit, a comparator circuit having a plurality of removable resistors, wherein one of the removable resistors is a voltage sensing resistor, and an output circuit having a transistor, wherein the output circuit receives an output current from the comparator circuit and outputs a current to a signaling device to actuate the signaling device;

determining a resistive value of the two removable resistors from the first branch circuit and a resistive value of the single removable resistor of the second branch circuit based on the known resistance of the first variable resistance device such that a ratio of the two removable resistors from the first branch circuit is equal to a ratio of the single removable resistor and the resistance of the first variable resistance device of the second branch circuit;

determining a resistive value of the plurality of removable resistors of the comparator circuit to determine a reference voltage;

inserting the removable resistors of the bridge circuit and the comparator circuit into the printed circuit board;

inserting the printed circuit board into the control circuit;

applying power to the control circuit;

comparing a voltage across the voltage sensing resistor to the reference voltage;

verifying the resistance of the first variable resistance device;

determining that the voltage across the voltage sensing resistor is less than the reference voltage;

outputting an output current from the comparator circuit;

saturating the transistor;

allowing current to flow from a collector to an emitter of the transistor;

outputting a current from the emitter to a control relay;

energizing the control relay;

actuating the signaling device;

verifying that the resistance of the first variable resistance device is correct removing the power to the control circuit;

removing the printed circuit board containing the universal resistance testing device from the control circuit;

removing the removable resistors of the first and second branch circuits of the bridge circuit from the printed circuit board;

removing the first variable resistance device from the second branch circuit of the bridge circuit;

determining a resistive value of two different removable resistors from the first branch circuit and a resistive value of a different single removable resistor of the second branch circuit based on a known resistance of a second variable resistance device such that a ratio of the two different removable resistors from the first branch circuit is equal to a ratio of the different single removable resistor and the resistance of the second variable resistance device of the second branch circuit;

determining a resistive value of a plurality of different removable resistors of the comparator circuit to determine a different reference voltage;

inserting the different removable resistors of the bridge circuit and the comparator circuit into the printed circuit board;

inserting the printed circuit board into the control circuit;

applying power to the control circuit;

comparing a voltage across the voltage sensing resistor to the different reference voltage; and verifying the resistance of the second variable resistance device, wherein the resistance of the second variable resistance device has a resistance substantially different than the resistance of the first variable resistance device.

15. The method of claim 14, wherein the output circuit includes a transistor, the method further comprising the steps of:

determining that the voltage across the voltage sensing resistor is not less than the reference voltage; and determining that the resistance of the variable resistance device is not correct.

\* \* \* \* \*